United States Patent
Sims et al.

(10) Patent No.: US 10,677,827 B2
(45) Date of Patent: *Jun. 9, 2020

(54) CHARGING SYSTEMS WITH DIRECT CHARGING PORT SUPPORT AND EXTENDED CAPABILITIES

(71) Applicant: Apple Inc., Cupertino, CA (US)

(72) Inventors: Nicholas A. Sims, San Francisco, CA (US); Jeffrey J. Terlizzi, San Francisco, CA (US); Alexei Kosut, Mountain View, CA (US); Timothy Johnson, San Jose, CA (US); Barry Corlett, Brisbane, CA (US)

(73) Assignee: Apple Inc., Cupertino, CA (US)

( * ) Notice: Subject to any disclaimer, the term of this patent is extended or adjusted under 35 U.S.C. 154(b) by 288 days.

This patent is subject to a terminal disclaimer.

(21) Appl. No.: 15/489,467

(22) Filed: Apr. 17, 2017

(65) Prior Publication Data

US 2017/0219641 A1 Aug. 3, 2017

Related U.S. Application Data

(60) Continuation of application No. 14/268,945, filed on May 2, 2014, now Pat. No. 9,651,593, which is a
(Continued)

(51) Int. Cl.
*H02J 7/04* (2006.01)
*H02J 7/00* (2006.01)
(Continued)

(52) U.S. Cl.
CPC ............. *G01R 27/02* (2013.01); *G01L 1/205* (2013.01); *H02J 7/042* (2013.01); *H02M 7/02* (2013.01);
(Continued)

(58) Field of Classification Search
None
See application file for complete search history.

(56) References Cited

U.S. PATENT DOCUMENTS 6,833,686 B2   12/2004   Veselic et al.
6,936,936 B2   8/2005    Fischer et al.
(Continued)

FOREIGN PATENT DOCUMENTS

EP   2092407 A1   8/2009
EP   2278668 A2   1/2011
(Continued)

OTHER PUBLICATIONS

"Battery Charging Specifications," USB Implementers Forum, Inc., Apr. 15, 2009, Revision 1.1 (44 pages) [Retreived on Dec. 20, 2012]. Retrieved from the Internet: <URL:http://www.usb.org/developers/devclass_docs/batt_charging_1_1zip>.
(Continued)

*Primary Examiner* — Paresh Patel
(74) *Attorney, Agent, or Firm* — Treyz Law Group, P.C.; G. Victor Treyz; Michael H. Lyons (57) ABSTRACT

An alternating current (AC) to direct current (DC) power converter may have a connector with a pair of power supply contacts and a pair of data contacts. An electronic device may be connected to the connector of the power converter. The power converter may supply DC power to the electronic device using the power supply contacts. The power converter may include control circuitry that has a resistor coupled across the data contacts. When the electronic device and the power converter are connected to each other, each may advertise to the other that capabilities are present that exceed industry standards. At the same time, standard-compliant discovery operations may be performed to probe the value of the resistance of the resistor that is coupled across the data contacts. When extended capabilities are
(Continued)

discovered, extended functions may be performed including accelerated charging functions and data communications functions.

20 Claims, 5 Drawing Sheets

Related U.S. Application Data division of application No. 12/766,840, filed on Apr. 23, 2010, now Pat. No. 8,717,044.

(51) Int. Cl.

| | | |
|---|---|---|
| *G01R 27/02* | (2006.01) | |
| *H02M 7/02* | (2006.01) | |
| *G01L 1/20* | (2006.01) | |
| *H02M 7/538* | (2007.01) | |
| *H02M 7/53846* | (2007.01) | |
| *H02M 7/539* | (2006.01) | |

(52) U.S. Cl.
CPC ....... *H02M 7/539* (2013.01); *H02M 7/53803* (2013.01); *H02M 7/53846* (2013.01); *H02J 7/00* (2013.01); *H02J 7/00034* (2020.01)

(56) References Cited

U.S. PATENT DOCUMENTS

| | | | |
|---|---|---|---|
| 7,133,278 | B2 | 11/2006 | Amdahl et al. |
| 7,170,259 | B2 | 1/2007 | Veselic |
| 7,358,703 | B2 | 4/2008 | Veselic |
| 7,701,168 | B2 | 4/2010 | Thijssen |
| 8,225,114 | B2 | 7/2012 | Li et al. |
| 8,717,044 | B2 | 5/2014 | Sims et al. |
| 9,651,593 | B2 * | 5/2017 | Sims ................... H02J 7/042 |
| 2004/0042138 | A1 | 3/2004 | Saito et al. |
| 2004/0251878 | A1 | 12/2004 | Veselic |
| 2005/0174094 | A1 | 8/2005 | Purdy et al. |
| 2006/0005055 | A1 | 1/2006 | Potega |
| 2006/0015757 | A1 | 1/2006 | Tupman et al. |
| 2007/0085675 | A1 | 4/2007 | Darsan et al. |
| 2008/0042616 | A1 | 2/2008 | Monks et al. |
| 2008/0258688 | A1 | 10/2008 | Hussain et al. |
| 2010/0016334 | A1 | 1/2010 | Sarkar et al. |
| 2010/0070659 | A1 | 3/2010 | Ma et al. |
| 2010/0237840 | A1 | 9/2010 | Walter et al. |
| 2011/0040901 | A1 | 2/2011 | Khan et al. |
| 2011/0068626 | A1 | 3/2011 | Terlizzi et al. |

FOREIGN PATENT DOCUMENTS

| | | |
|---|---|---|
| EP | 2296248 A2 | 3/2011 |
| EP | 2278668 A2 | 7/2011 |
| JP | 2005006497 | 6/2005 |
| JP | 2009060716 | 3/2009 |

OTHER PUBLICATIONS

Terry Remple, "Battery Charging Specification," Revision 1.1, Apr. 15, 2009, USB Implementers Forum.
"STUSBCD01B configuration and operation", [online], STMicroelectronics, Sep. 2009, [retrieved on Apr. 23, 2010], <URL:http://www.st.com/stonline/products/literature/an/15283.pdf>.
Kanamori et al., "USB battery-charger designs meet new industry standards", [online], Feb. 21, 2008, [retrieved on Mar. 2, 2010], <URL:http://www.edn.com/index.asp?layout=articlePrint&articleID=CA6531593>.

* cited by examiner

CHARGING SYSTEMS WITH DIRECT CHARGING PORT SUPPORT AND EXTENDED CAPABILITIES

This application is a continuation of patent application Ser. No. 14/268,945, filed on May 2, 2014 which is a division of patent application Ser. No. 12/766,840, filed Apr. 23, 2010 now U.S. Pat. No. 8,717,044 are hereby incorporated by reference herein in their entirety. This application claims the benefit of and claims priority to patent application Ser. No. 14/268,945, filed May 2, 2014 and patent application Ser. No. 12/766,840, filed Apr. 23, 2010 now U.S. Pat. No. 8,717,044 issued May 6, 2014.

BACKGROUND

This relates to systems in which power converters are used to charge electronic devices.

Power converter circuitry can be used to convert alternating current (AC) power into direct current (DC) power. AC power is typically supplied from wall outlets and is sometimes referred to as line power. Electronic devices include circuitry that runs from DC power. The DC power that is created by an AC-to-DC power converter may be used to power an electronic device. The DC power that is created may also be used to charge a battery in an electronic device.

Some electronic devices have input-output ports that include power and data lines. For example, some electronic devices have input-output ports such as Universal Serial Bus ports that include a pair of power lines and a pair of data lines. Universal Serial Bus (USB) connectors and other connectors may be used in ports such as these.

During normal operation of an electronic device, the USB port of a device may be used to convey power and data signals. For example, the USB port may be used to power a peripheral such as a printer or camera, to transfer data to and from an accessory, etc. Devices with batteries may be charged by drawing DC power from the power lines in the USB port. For example, a battery in a cellular telephone may be charged when the cellular telephone is connected to a USB port of a computer.

It can be convenient to charge electronic devices using USB ports on computers, but computer ports such as these are designed to supply only a limited amount of power. Faster charging can be achieved using stand-alone power converters. Stand-alone power converters can be provided with cables that have Universal Serial Bus plugs. This type of USB plug may be inserted into a Universal Serial Bus port on an electronic device, allowing the device to be charged from a wall outlet without involving a computer.

Although stand-alone USB chargers such as these may offer more charging power than the USB port on a computer, the capabilities of stand-alone USB chargers and other aspects of USB-based charging systems may be limited by industry standards.

It would therefore be desirable to be able to provide improved charging systems such as charging systems in which power is conveyed over input-output port paths such as Universal Serial Bus paths.

SUMMARY

To comply with industry standards, an alternating current (AC) to direct current (DC) power converter and electronic device may conform to expected discovery protocols. The power converter and electronic device may be connected using connectors that have a pair of power lines and a pair of data lines such as a Universal Serial Bus connector. The power converter may include a resistor across its data lines. During discovery operations, the electronic device may generate a probe signal such as a probe current that is routed through the resistor. The electronic device may use the probe signal to measure the resistance of the resistor in the power converter.

In addition to standards-compliant capabilities, the AC-DC power converter and the electronic device may have extended capabilities. These extended capabilities may include features that support enhanced power transfer capabilities, data transfer capabilities to support the transfer of status and diagnostic data, and other functions.

The AC-DC power converter and the electronic device may support standards-compliant discovery operations such as operations related to presenting and detecting the resistor across the data lines. During these discovery operations or after a delay, the AC-DC power converter and electronic device may exchange additional modulated signals. These modulated signals may take the form of current pulses, voltage pulses or other signals that are modulated as a function of time and/or magnitude. Transmitter circuitry and corresponding receiver circuitry may be used in the power converter and in the electronic device to support unidirectional and bidirectional communications. The transmitter circuitry may be based on current sources, voltage sources, switches, or other circuit components that are modulated using communications circuitry. The receiver circuitry may include comparators and other receiver circuits that convert transmitted signals into received data.

When a power converter or electronic device with extended capabilities is connected to equipment without extended capabilities, the extended-capability equipment reverts to standards-compliant behavior, thereby preserving compatibility between a variety of equipment.

Further features of the invention, its nature and various advantages will be more apparent from the accompanying drawings and the following detailed description of the preferred embodiments.

DETAILED DESCRIPTION

Power converters (sometimes referred to as power adapters) may be used to convert alternating current (AC) power into direct current (DC) power. A power converter may have a plug that plugs into a wall socket to obtain AC line power. The power converter may also have an output path on which DC power is provided that has been created from the AC line power. In some situations, AC-DC power converter circuitry may be built into computers and other electronic equipment. In other situations, AC-DC power converter circuitry is used to form stand-alone power converters. Charging systems that include stand-alone power converters are sometimes described herein as an example.

Power converters can be used to power electronic devices that use DC power. In a device that contains a rechargeable battery, DC power from a power converter can also be used to charge the battery. In this type of situation, an AC-DC power converter can serve as a stand-alone charger. AC-DC power converters are therefore sometimes referred to as battery chargers.

Industry standards may place limits on the behavior of power converters and the electronic devices that are powered by the power converters. For example, industry standards may dictate that stand-alone (dedicated) Universal Serial Bus (USB) chargers present a shunt resistance of less than 200 ohms across their data lines. According to industry standard protocols, the presence of this resistance can be detected by an attached electronic device. When detected, the electronic device can conclude that a dedicated charger is present and can draw more power than would otherwise be available through a computer-based USB port. Although industry standards may allow the stand-alone charger to charge a battery in an electronic device more rapidly than would be possible using a computer-based USB port, these standards may also place limits on the maximum power that a stand-alone charger can deliver and limits on the maximum power that an electronic device can draw from the charger. Limits of this type may undesirably restrict the use of the charger and electronic device.

Figure 1:
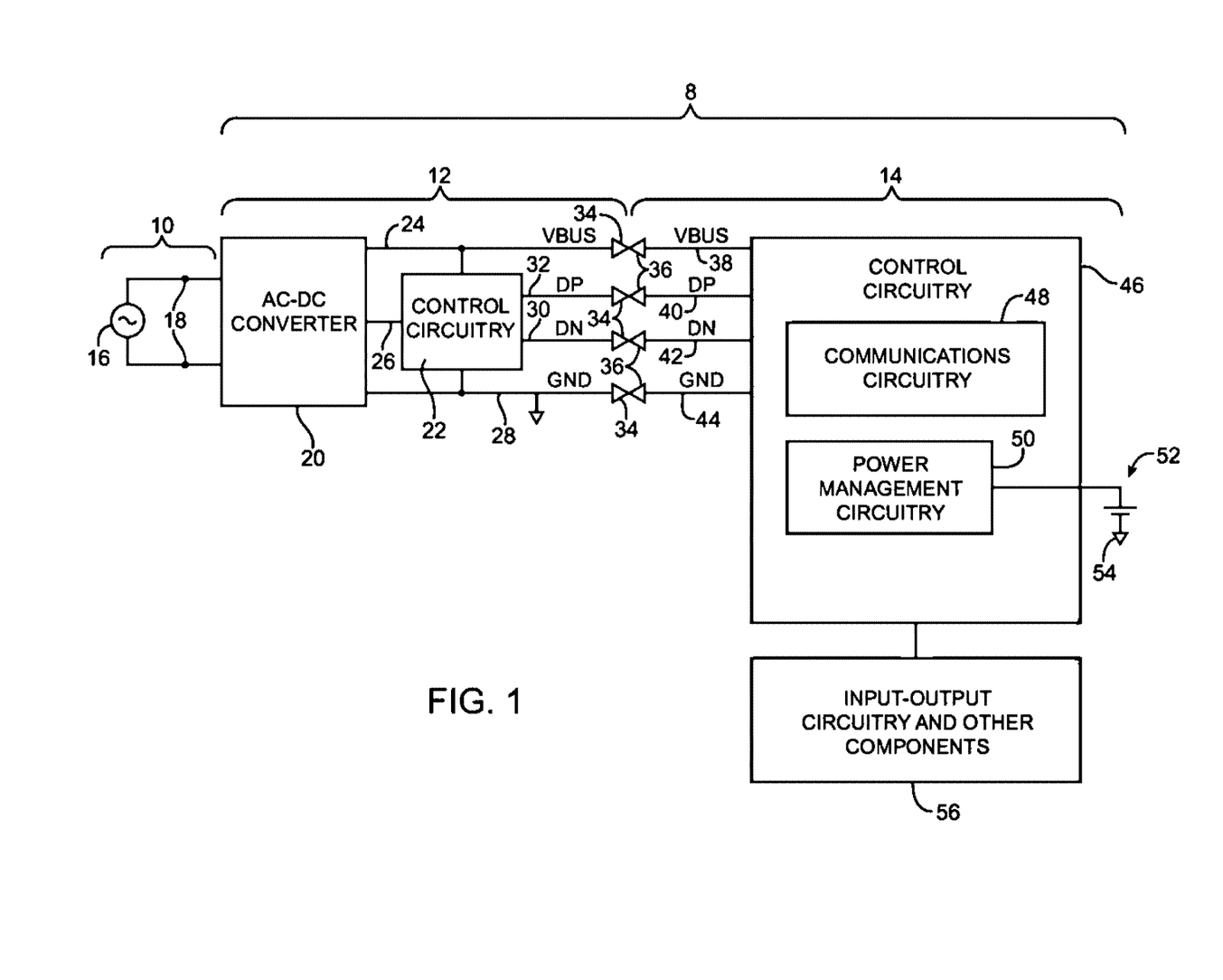
FIG. 1 is a circuit diagram of a system including a power converter and an electronic device in accordance with an embodiment of the present invention.

These shortcomings can be addressed using a charging system of the type shown in FIG. 1. As shown in FIG. 1, charging system 8 may include a source of line power such as alternating current (AC) source 16, a power converter such as stand-alone (dedicated) charger 12, and an electronic device such as device 14.

AC source 16 may be, for example, a wall outlet or other AC power source. Power converter 12 may convert AC power from source 16 to direct-current (DC) power for powering electronic device 14. Electronic device 14 may be a portable electronic device such as a cellular telephone, tablet computer, notebook computer, media player, gaming device, remote control, or other electronic equipment.

Power converter 12 may have a plug that mates with a corresponding wall outlet (shown as mating connectors 18 in FIG. 1). This supplies AC power to AC-DC converter circuitry 20. AC-DC converter circuitry 20 may be based on a switched-mode AC-DC converter circuit and may supply DC power on power lines 24 and 28. During normal operation, AC-DC converter circuit 20 may supply a positive power supply voltage Vbus (e.g., 2-5 volts, less than 2 volts, more than 5 volts, etc.) on positive power supply line 24 and may supply a ground voltage GND (e.g., a signal at 0 volts) or ground power supply line 28.

Converter 12 may have a permanently connected cable or may have a detachable cable that is terminated in a connector such as a USB connector (e.g., a USB plug). This connector may have a number of contacts that make electrical contact with corresponding contacts in a connector on device 14.

As shown in FIG. 1, power converter 12 may have a four-contact USB connector (connector 34) that includes a VBUS contact, data line contacts DP and DN, and a GND contact. The VBUS contact in connector 34 is electrically connected to positive power supply line 24. The GND contact in connector 34 is electrically connected to ground line 28. Lines 32 and 30 in power converter 12 are electrically connected to the DP and DN contacts in connector 34, respectively.

Device 14 may likewise have a four-contact USB connector (connector 36) that includes a VBUS contact connected to positive power supply line 38 (e.g., to carry voltage VBUS), data line contacts DP and DN that are respectively connected to DP and DN data lines 40 and 42, and a GND contact connected to ground line 42. Connectors 34 and 36 may be provided using any suitable form factor (e.g., as mini-USB connectors, as micro-USB connectors, as a set of 4 USB pins that form part of a larger connector such as a 30-pin connector, etc.).

The VBUS contact in connector 36 and the GND contact in connector 36 and corresponding power supply lines 38 and 44 can be used to convey DC power from power converter 12 to the circuitry of device 14 (e.g., to power device 14). Device 14 can also be powered using an internal battery such as battery 52. Battery 52 may be a rechargeable battery such as a lithium-ion battery. Battery 52 may be coupled between power management circuit 50 in control circuitry 46 and ground 54. When battery 52 is fully charged and device 14 is running from battery power, power management circuit 50 can be used to deliver battery power to the circuitry of device 14 and power converter 12. When battery 52 is depleted and DC power is available from power converter 12 on lines 38 and 44, charging circuitry in power management circuit 50 can be used to charge battery 52 with the DC power.

Device 14 may include input-output circuitry and other components 56 and control circuitry 46 that includes power management circuit 50 and communications circuitry 48. Input-output circuitry and other components 56 may include buttons, displays, speakers, microphones, sensors, and other electronic components. Control circuitry 46 may be based on one or more integrated circuits (e.g., memory chips, audio and video integrated circuits, microprocessors, digital signal processors, application-specific integrated circuits, etc.).

During normal operation of device 14, connector 36 and associated power lines 38 and 44 and data lines 40 and 42 may serve as a USB port. A USB port can convey DC power (VBUS and GND) and can convey data using data lines DP and DN. For example, if device 14 is connected to a peripheral, device 14 may use the power lines to supply power to the peripheral and may use the data lines to support bidirectional communications with the accessory.

When connected to power adapter 12, device 14 and power adapter 12 may interact with each other to determine each other's capabilities. In a conventional dedicated charger that is compliant with USB-IF standards, a resistor of less than 200 ohms is connected between the DP and DN lines in the charger. The presence of this shunt resistor serves as a flag that informs connected devices that the charger is a dedicated charger and not a USB computer port. Power converter 12 of FIG. 1 can replicate this behavior using control circuitry 22 when needed. This allows power converter 12 to serve as a standards-compliant charger (e.g., a USB-IF dedicated charger) when desired (i.e., when interacting with devices that are only capable of standards-compliant operation). When a device such as device 14 of FIG. 1 that has extended capabilities (i.e., capabilities beyond the capabilities defined by applicable industry standards such as USB-IF standards), power converter 12 and device 14 can exhibit enhanced capabilities.

As shown in FIG. 1, control circuitry 22 may be connected to the DP and DN data line connectors in connector 34 by data lines 32 and 30. Control circuitry 22 may be coupled to AC-DC converter circuit 20 by control path 26. Control path 26 may be used to issue commands to AC-DC converter (e.g., so that control circuitry 22 may place AC-DC converter 20 in a sleep mode and so that control circuitry 22 may awaken AC-DC converter circuit 20 from sleep mode). Control circuitry 22 may also be coupled to positive power supply line 24 and ground line 28.

Control circuitry 22 may include a resistive element such as a resistor with a value of less than 200 ohms and may contain switching circuitry that selectively connects this resistive element in a shunt resistor configuration bridging data lines 32 and 30. When configured in this way, electronic devices that are connected to power converter 12 can determine that converter 12 is capable of serving as a dedicated charger (i.e., as a charger that is compliant with industry standards such as USB-IF standards). Control circuitry 22 may also include communications circuitry that supports communications with communications circuitry 48 of device 14.

The communications circuitry in control circuitry 22 and control circuitry 46 may use unidirectional signaling schemes (i.e., schemes in which capabilities are advertised exclusively or primarily in one direction) and bidirectional signaling schemes (i.e., communications schemes in which information is exchanged between power converter 12 and device 14 in both directions). In bidirectional signaling schemes, features such as handshaking may be implemented. Communications between power converter 12 and device 14 may be implemented using any suitable type of protocols (e.g., USB protocols, less complex protocols, more complex protocols, etc.).

Figure 2:
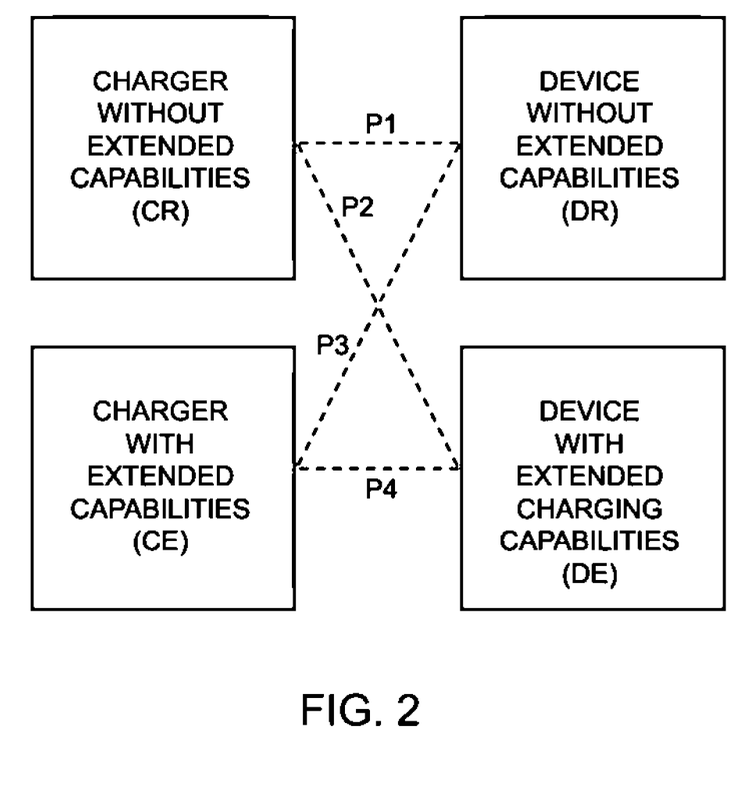
FIG. 2 is a diagram showing how chargers and electronic devices with different levels of charging capabilities and other capabilities may be interconnected in a variety of pairings in accordance with an embodiment of the present invention.

Users may have access to different types of power converters and different types of electronic devices. Particularly in environments in which commonly available port connectors are used, a variety of different pairings between power converters and electronic devices are possible. Consider, for example, an environment of the type shown in FIG. 2. As shown in FIG. 2, a user may have access to two different types of power converter (type CR and type CE) and may have access to two different types of electronic device (type DR and type DE). This may lead to four possible pairings P1, P2, P3, and P4 between power converters and devices, as illustrated by the dashed line in FIG. 2.

Power converter CR may be compliant with industry standards (e.g., USB-IF standards) and may not have any extended capabilities beyond those specified by the industry standards. For example, power converter CR may only be able to produce voltages and currents that fall within the limits prescribed by the industry standards. Power converter CR may include a resistor with a value of less than 200 ohms that is connected between data lines DP and DN in power converter CR. The presence of this resistor may be used to advertise to electronic devices that power converter CR is compliant with USB-IF standards (or other such industry standards).

Power converter CE may have capabilities that extend beyond the limits imposed by the industry standards with which power converter CR complies. For example, power converter CE may be capable of delivering more DC power than power converter CR. Power converter CE may also have the capability to operate a lower voltages than converter CR (i.e., at voltages Vbus that are lower than permitted by the industry standards with which power converter CR complies). Examples of other extended capabilities that power converter CR may have include low-power-mode capabilities (i.e., capabilities to support sleep mode, hibernate mode, etc.), the ability to gather and store diagnostic information, the ability to accept power from an attached electronic device, the ability to upload diagnostic information to an attached device, the ability to support authentication operations, the ability to send and receive status information related to the power converter and electronic device operations, etc.).

The industry standards with which power converter CR is compliant may be silent with respect to some of the extended features of power converter CE, but may actively prohibit use of other extended features. For example, USB-IF standards may be silent with respect to gathering diagnostic information, but may set lower limits on the amount of voltage that a power converter may supply. A power converter that follows USB-IF standards may, for example, be required to supply 5 volts of output power at current levels of 0-0.5 A. Power converter CE may have the ability (in this example) to supply output powers of less than 5 volts at current levels of 0-0.5 A.

Electronic device DR may be compliant with industry standards (e.g., USB-IF standards). In accordance with these standards, device DR may be configured to draw less than a maximum allowed amount of DC power from a charger. Device DE may have capabilities other than those permitted by the industry standards with which electronic device DR is compliant. Device DE may, for example, be capable of drawing more power from a charger than device DE (i.e., more power than permitted by the industry standards with which electronic device DR is compliant).

In order to ensure interoperability with standards-compliant equipment such as power converter CR and device DR, power converter CE and device DE may use their control circuitry to detect when the use of extended capabilities is appropriate. If standards-compliant behavior is needed for compatibility, devices CE and DE can comply with the applicable standards. If devices CE and DE are connected to each other, there is no longer any need for maintaining standards compliance, so the extended capabilities of one or both of these items of equipment may be used.

The way in which the power converters and electronic devices of FIG. 2 operate depends on how they are paired. Consider, as an example, a situation in which power converter CR is connected to device DR (pairing P1). In this situation, power converter CR presents a resistance R of less than 200 ohms between its DP and DN lines to indicate that power converter CR is a dedicated charger and is compliant with relevant industry standards (e.g., USB-IF standards). Device DR detects the presence of this resistance and operates accordingly by drawing as much power as permitted for a standards-compliant device that is connected to a standards-compliant dedicated charger. Following the limits of the industry standards, both power converter CR and device DR operate within prescribed bounds on current and voltage levels. For example, at currents of 0-0.5 A, Vbus is maintained above 5 volts and at currents of 0.5 to 1.5 A, Vbus is maintained above 2 volts. Currents above 1.5 A are not supplied by power converter CR and are not requested by device DR.

When power converter CR is connected to device DE (pairing P2), power converter CR will also present a resistance R of less than 200 ohms between its DP and DN lines to indicate that power converter CR is a dedicated charger and is compliant with relevant industry standards (e.g., USB-IF standards). Device DE may be a device such as electronic device 14 of FIG. 1. When connected to power converter CR, device DE may use control circuitry such as control circuitry 46 of FIG. 1 to measure the value of the resistance between the DP and DN contacts in power converter CR. If device DE detects that the resistance across the DP and DN lines in power converter CR is less than 200 ohms and if device DE does not detect extended capabilities in power converter CR, device DE can conclude that power converter CR is compliant with industry standards (e.g. USB-IF standards) and can operate accordingly by drawing only as much power as permitted for a standards-compliant device that is connected to a standards-compliant dedicated charger.

Pairing P3 occurs when a power converter with extended (non-industry-standard) features (i.e., power converter CE) is connected to device DR. Power converter CE may, for example, be a power converter such as power converter 12 of FIG. 1. When power converter CE and device DR are connected, power converter CE will uses its control circuitry (i.e., circuitry 22 of FIG. 1) to present a resistance R of less than 200 ohms between its DP and DN lines. This indicates to device DR that power converter CE is able to function as a dedicated charger that is compliant with relevant industry standards (e.g., USB-IF standards). Once device DR detects that the resistance across the DP and DN lines in power converter CE is less than 200 ohms, device DR can conclude that power converter CE is compliant with industry standards (e.g. USB-IF standards) and can operate accordingly by drawing only as much power as permitted for a standards-compliant device that is connected to a standards-compliant dedicated charger. In the absence of additional information that indicates to power converter CE that the attached electronic device has extended capabilities, power converter CE will refrain from using extended capabilities that would violate the applicable industry standards. For example, power converter CE will refrain from supplying output voltages and currents in disallowed ranges.

In pairings such as pairing P4, a charger with extended capabilities may be connected to an electronic device with extended capabilities. In particular, pairing P4 may arise when a power converter with extended (non-industry-standard) features (i.e., power converter CE) is connected to an electronic device with extended capabilities such as device DE. Power converter CE may be a power converter such as power converter 12 of FIG. 1. Electronic device DE may be an electronic device such as electronic device 14 of FIG. 1.

When power converter CE and device DE are connected, power converter CE and device DE may exchange information to signal to each other that they have extended capabilities.

With one suitable arrangement, this type of information exchange may be primarily or exclusively unidirectional. As an example, power converter CE may actively or passively present information that is detectable by device DE that advertises the presence of extended capabilities to device DE.

With passive advertising approaches, control circuitry 22 may include a network of electrical components such as resistors, inductors, and capacitors that are connected between lines 24, 32, 30, and 28 (preferably in a way that does not interfere with the ability of power converter CE to present a shunt resistance R of less than 200 ohms across terminals DP and DN). As an example, power converter CE may present a capacitance C across DP and DN in parallel with the resistance R. At AC signal frequencies, this capacitor has a relative low resistance (i.e., the capacitor acts as a short circuit). The presence of the capacitor can therefore be detected by device DE by measuring the impedance between lines DP and DN at both DC and AC frequencies. Device DR can detect that the value of the shunt resistance is less than 200 ohms. Device DE can detect that R is less than 200 ohms (i.e., that R is 100 ohms) at DC and is lower at AC frequencies (e.g., at 1 kHz as an example). Other passive advertising schemes may be used if desired. For example, an inductor may be connected in series with the resistor R between terminals DP and DN so that a rise in impedance at AC frequencies can be detected, etc.

With active advertising approaches, control circuitry 22 may open and close a switch to modulate an electrical parameter. Control circuitry 22 may, for example, open and close a switch that is connected in series with a 100 ohm resistor between terminals DP and DN to modulate the resistance between terminal DP and DN. Control circuitry 22 may also generate voltage or current signals that are conveyed to device DE.

Device DE may similarly use passive or active unidirectional advertising schemes to make the capabilities of device DE detectable by power converter CE. For example, a network of detectable electrical components may be connected between lines 38, 40, 42, and 44, switching circuitry in communications circuitry 48 of control circuitry 46 may be used to modulate electrical parameters such as resistance, current, voltage, etc.

If desired, both power converter CE and device DE may contain circuitry that is configured to passively or actively advertise their respective extended capabilities.

Bidirectional communications between power converter CE and electrical device DE may also be supported. For example, control circuitry 22 and control circuitry 46 may each contain a USB communications circuit (e.g., a USB host or hub chip) or other suitable circuitry for conveying information (e.g., voltage sources, current sources, voltage detectors, current detectors, etc.). Any suitable modulation scheme (coding scheme) may be used when conveying information between power converter 12 and electronic device 14. Examples of modulation schemes that may be used include modulation schemes such as frequency modulation (FM) schemes, amplitude modulation (AM) schemes, pulse-code modulation (PCM) schemes, code-division-multiple-access (CDMA) schemes, phase-shift keying (PSK) schemes, and amplitude shift keying (ASK) schemes. As an example, the presence or absence of different AC frequencies (tones) may be used to represent information, patterns of pulses may be used to represent information, etc.

Figure 3:
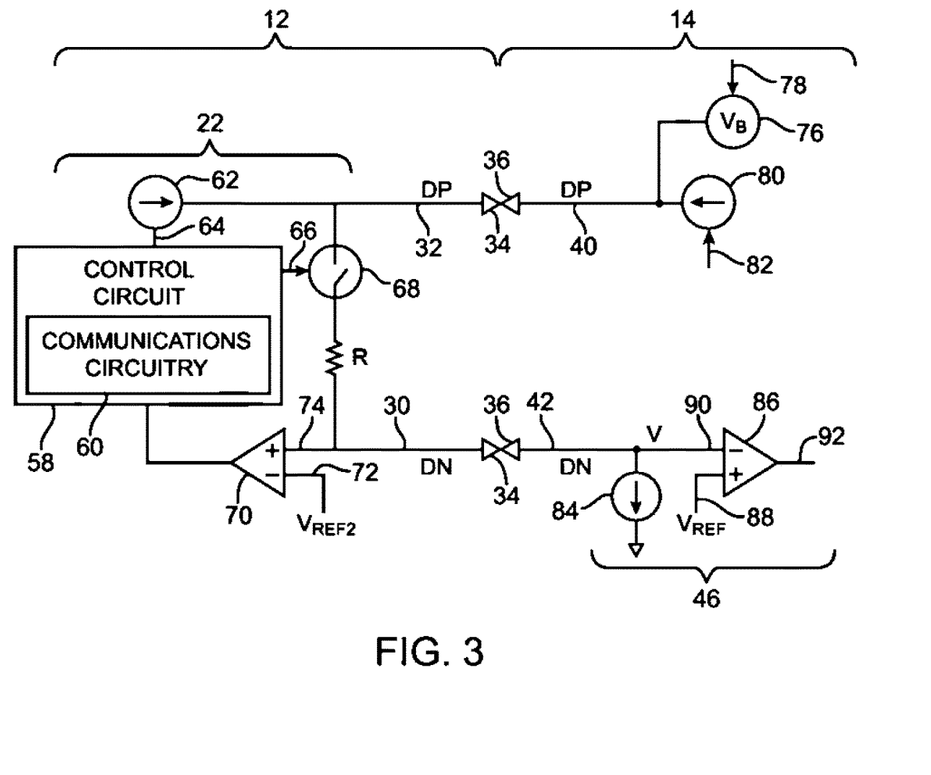
FIG. 3 is a circuit diagram of an illustrative charger and electronic device in accordance with an embodiment of the present invention.

Illustrative circuitry that may be used to support communications in a power converter with extended capabilities such as power converter 12 of FIG. 1 and an electronic device with extended capabilities such as electronic device 14 is shown in FIG. 3. As shown in FIG. 3, power converter 12 may include control circuitry 22 and electronic device 14 may include control circuitry 46. As described in connection with FIG. 1, control circuitry 22 and control circuitry 46 may include communications circuitry (e.g., communications circuit 60 in control circuit 58 of FIG. 3 and communications circuitry 48 in control circuitry 46 of FIG. 1) and may be based on one or more integrated circuits such as USB integrated circuits (host and hub controllers), microprocessors, digital signal processors, application-specific integrated circuits, etc. This communications circuitry may generate control signals that are applied to control lines such as control line 64 of controllable current source 62, control line 66 of controllable switch 68, control line 78 of controllable voltage source 76, and control line 82 of controllable current source 80. Controllable components such as current sources 62 and 80, voltage source 76, and switching circuitry 68 are merely illustrative examples of components that may serve as transmitter circuitry for device 14 and that may be used in conveying modulated signals (e.g., signals that vary as a function of time and/or magnitude) between power converter 12 and electronic device 14. Moreover, power converter 12 and device 14 need not include all of these components. These components are included in the diagram of FIG. 3 as an example.

It may be desirable for power converter 12 to present a resistance R (e.g., a resistance R of less than 200 ohms) between lines DP and DN to indicate to electronic devices that power converter 12 is capable of operating in compliance with industry standards (e.g., USB-IF standards) for stand-alone (dedicated) chargers. This may be done using resistor R of FIG. 3. Optional series-connected switch 68 may normally be closed.

During an initial discovery process (i.e., when switch 68 is closed), device 14 may use current source 80 to apply a current to resistor R while using current sink 84 to sink returned current on line 42 to ground. The value of the resulting voltage V at input 90 of comparator 86 is compared by comparator 86 to reference voltage Vref at input 88 of comparator 86. Comparator 86 then produces a corresponding output signal (e.g., a logic high or low value) on output line 92. The value of voltage V on input 90 is indicative of the value of resistor R. If resistor R is less than 200 ohms, V will be less than Vref and output 92 will go high. If resistor R is greater than 200 ohms (in this example), output 92 will be taken to a logic low value. If control circuitry 46 measures a high value at output 92, device 14 can therefore conclude that power converter 12 is at least capable of operating in compliance with industry standards (i.e., as a dedicated charger in compliance with USB-IF standards).

Additional discovery operations may be performed by electronic device 14 to determine whether power converter 12 has extended capabilities (and vice versa). For example, electronic device 14 may issue a pattern of signal pulses (e.g., voltage pulses produced by modulating the voltage on voltage source 76 or current pulses produced by modulating the current produced by current source 80). Control circuitry 22 may use comparator 70 or other suitable detector (receiver) circuitry to receive the signal pulses transmitted by electronic device 14. Comparator 70 may have a first input (input 72) that receives reference voltage Vref2 and a second input (input 74) that receives signal pulses that have been transmitted by electronic device 14 (e.g., using current source 80, voltage source 76, or other signal transmitting circuitry). As incoming pulses are detected, the output of comparator 70 changes state and provides digital output pulses of correspondingly changing values to control circuit 58. In this respect, comparator 70 serves as a receiver for signals transmitted by electronic device 14. If desired, receiver 70 may be sensitive to signals encoded using multiple different values (i.e., patterns of signals with different voltage values, patterns of signals with different current values, etc.).

Power converter 12 can similarly transmit signals to electronic device 14. For example, control circuit 58 may transmit current pulses to electronic device 14 (e.g., using current source 62) that are detected using comparator 86 or other suitable receiver circuitry in device 14, may transmit pulses by opening and closing switch 68 to modulate the resistance between lines 32 and 30 (e.g., so that device 14 can detect this change using current source 80 and comparator 86 or other suitable detection circuitry), etc.

The signals that are transmitted from electronic device 14 and power converter 12 may be used to inform power converter 12 that electronic device 12 has extended capabilities, as described in connection with device DE of FIG. 2. Similarly, the signals that are transmitted from power converter 12 to electronic device 14 may be used to inform electronic device 14 that power converter 12 has extended capabilities, as described in connection with power converter CE of FIG. 2. Transmitted signals may also be used for handshaking and to transmit status data, diagnostic data, control data, and other data between power converter 12 and device 14. In some circumstances, power converter 12 may not be connected to line power, so power lines 38 and 44 may, if desired, be used to convey DC power from battery 52 (FIG. 1) to control circuit 58 and the other circuitry of control circuitry 22. This allows power converter 12 to be operated even if AC-DC converter 20 is experiencing a fault.

To facilitate troubleshooting, power converter 12 may use control circuitry 22 to periodically store status information (i.e., information on fault conditions, circuit health, etc.). This stored information may be organized in the form of a diagnostic log. If a fault occurs in AC-DC converter circuitry 20, electronic device 14 may be connected to power converter 12 to supply control circuitry 22 with power, even in the absence of DC power from AC-DC converter 20. Because control circuitry 22 can be powered in this way, control circuitry 22 may upload performance data from the diagnostic log once communications are established between power converter 12 and electronic device 14.

To ensure that equipment with extended capabilities such as power converter CE and electronic device DE is able to interoperate with standards-compliant equipment, the signaling techniques that are used to advertise and detect the presence of extended capabilities may be arranged so as not to interfere with standards-compliant detection protocols. For example, the presence of extended capabilities may be advertised (e.g., using signal pulse codes) while remaining within voltage and current limits defined by industry standards.

Figure 4:
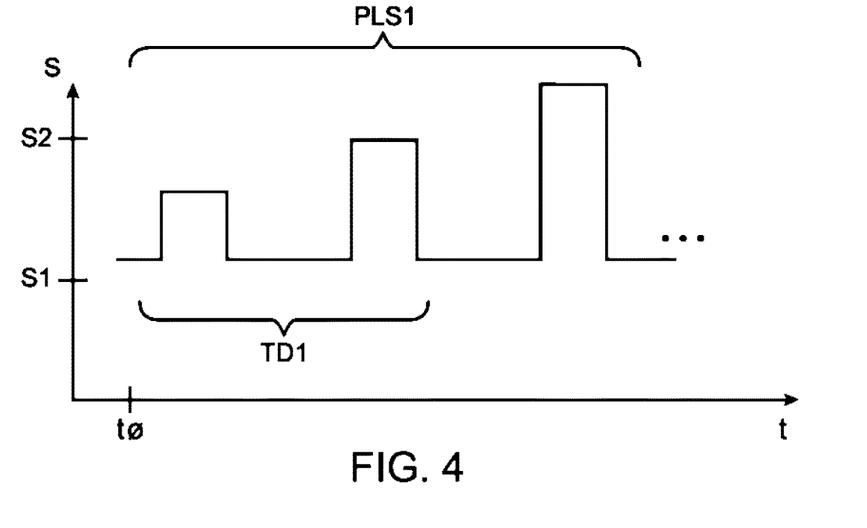
FIG. 4 is a graph showing an illustrative signaling pattern that may be used to convey information between a device of the type shown in FIG. 3 and a charger of the type shown in FIG. 3 in accordance with an embodiment of the present invention.

An example of this type of signaling scheme is shown in the graph of FIG. 4. In the graph of FIG. 4, signal strength S (voltage, current, etc.) is plotted as a function of time. The components in system 8 (i.e., power converter 12 and electronic device 14) are connected to each other by plugging in their USB connectors or other suitable connectors at time t0. The signal S corresponds to a signal that is applied by one component in system 8 to the other when the components are paired. As just one example, signal S may be a probe current that is applied across the DP and DN terminals in power converter 12 by electronic device 14 as electronic device 12 measures the value of R as described in connection with FIG. 3. Industry standards may require that the value of the probe current fall within certain limits (shown as lower signal magnitude limit S1 and upper signal magnitude limit S2 in the example of FIG. 4). To ensure that industry standards are not violated during the discovery process, signal S may remain within these limits. However, rather than using a DC signal that remains within specified limits S1 and S2, signal S may be modulated (varied in time and/or magnitude).

Industry standards may specify that discovery operations such as the measurement of the value of resistor R take place within a particular time frame (shown schematically as discovery period TD1). Once discovery period TD1 is complete, pulses PLS1 need no longer conform to limits S1 and S2 (i.e., signal S can exceed these limits). If desired, signal pulses PLS1 may also remain within limits S1 and S2. The coded information that is conveyed in pulses PLS1 (or other transmitted signal information S) may advertise to power converter 12 that electronic device 14 has extended capabilities or may contain other suitable data.

In the example of FIG. 4, the components of system 8 were able to convey information to each other on the presence of their extended capabilities while simultaneously ensuring standards compliance (i.e., by presenting resistor R across terminals DP and DN in the power converter and by respecting limits S1 and S2 while measuring the value of R with a probe current or other measurement signal). Another way to ensure that equipment with extended capabilities such as power converter CE and electronic device DE is able to interoperate with standards-compliant equipment, involves using a delay period to avoid interference between standards-compliant discovery operations and communications associated with establishing and using extended capabilities.

Figure 5:
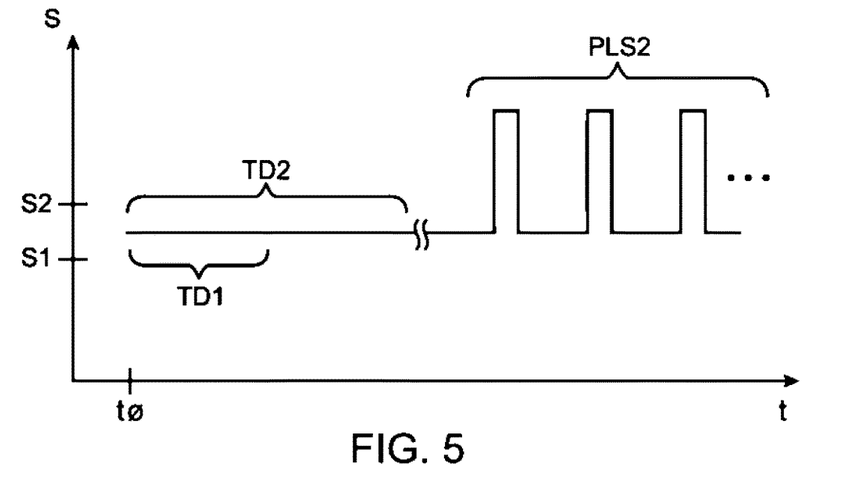
FIG. 5 is a graph showing another illustrative signaling pattern that may be used to convey information between a charger of the type shown in FIG. 3 and an electronic device of the type shown in FIG. 3 in accordance with an embodiment of the present invention.

This type of approach is illustrated in the example of FIG. 5. In FIG. 5, the strength of signal S (i.e., a probe current generated by current generator 80 of FIG. 3) is initially constant at a value that falls within specification limits S1 and S2. The standards-compliant discovery process in this type of arrangement will be completed within time TD1 after connecting power converter 12 and electronic device 14 at time t0. To ensure that changes to the value of probe signal S do not adversely affect compliance with industry standards, no changes may be made in the value of S until a delay time TD2 is complete. Because TD2 is greater than TD1, changes to the value of S after TD2 will not fall within time period TD1 and will therefore not interfere with the standards-compliant discovery operations performed during time period TD1. After time period TD2 has elapsed, signal S may therefore be modulated to form coded pulses PLS2 without regard to whether these signal pulses are within limits S1 and S2. Pulses PLS2 may be modulated in time, in magnitude, etc.

Figure 6:
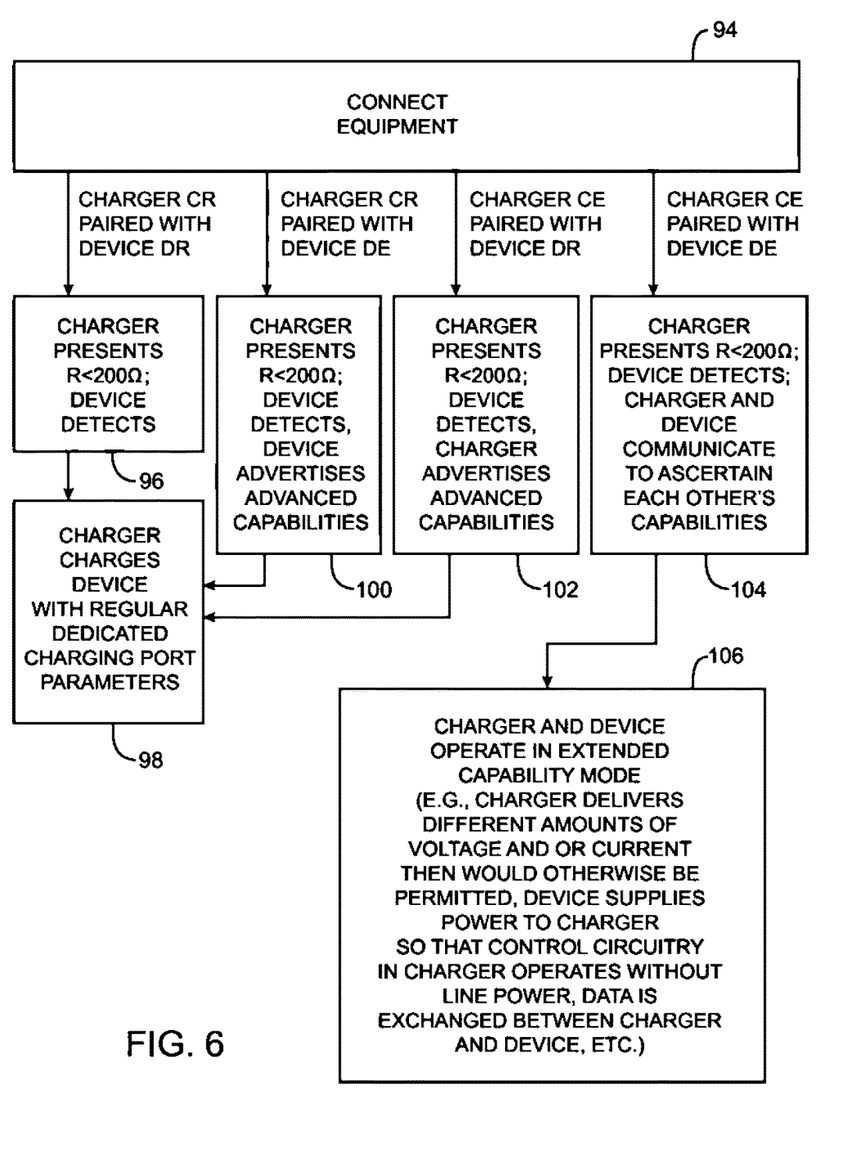
FIG. 6 is a flow chart of illustrative steps involved in operating a system that includes a power converter of the type shown in FIG. 1 and an electronic device of the type shown in FIG. 3 in accordance with an embodiment of the present invention.

Illustrative steps involved in operating power converters and electronic devices in various pairings of the type described in connection with FIG. 2 are shown in FIG. 6. At step 94, a user connects a power converter and electronic device. The power converter may be plugged into a source of line power or may be operated with battery power supplied by the electronic device. USB connectors or other connectors may be used to interconnect the power converter and electronic device.

The power converter and electronic device may only have capabilities that comply with industry standards (e.g., USB-IF standards for dedicated chargers) as described in connection with power converter CR and electronic device DR of FIG. 2 or may have extended capabilities as described in connection with power converter CE and electronic device DE. Different pairings between devices are possible.

If a power converter such as power converter CR is connected to an electronic device such as electronic device DR, the power converter may include a resistor R of less than 200 ohms across its DP and DN terminals. At step 96, device DR applies a probe signal across the DP and DN terminals and measures that R is less than 200 ohms.

At step 98, power converter CR and device DR may operate according to industry standards (e.g., USB-IF standards for dedicated chargers). In particular, power converter CR may power device DR and charge the battery in device DR in compliance with voltage and current limits specified in the industry standards.

If, at step 94, a user connects a power converter such as power converter CR to an electronic device such as electronic device DE, device DE may, at step 100, use schemes of the type described in connection with FIGS. 4 and 5 to detect the presence of a resistor R of less than 200 ohms across the DP and DN terminals, while also advertising the extended capabilities of electronic device DE (e.g., by transmitting a coded set of current pulses to power converter CR). Power converter CR (in this example) does not have extended capabilities, so power converter CR does not respond to the advertised extended capabilities of device DE. Rather, at step 98, power converter CR and device DE may operate according to industry standards (e.g., USB-IF standards for dedicated chargers). In particular, power converter CR may power device DE and charge the battery in device DE in compliance with voltage and current limits specified in the industry standards.

If a user connects a power converter such as power converter CE to an electronic device such as electronic device DR at step 94, charger CE may, at step 102, use schemes of the type described in connection with FIGS. 4 and 5 to advertise the presence of its extended capabilities while presenting a resistor R of less than 200 ohms across the DP and DN terminals to indicate to electronic device DR that power converter CE is able to operate according to industry standards (i.e., USB-IF dedicated charger standards). Device DR does not have extended capabilities, so device DR does not respond to the transmission of the signals from power converter CE that advertise the presence of extended capabilities. At step 98, power converter CE and device DR may therefore operate according to industry standards (e.g., USB-IF standards for dedicated chargers).

In some situations, a user will connect a power converter with extended capabilities (power converter CE) to a device with extended capabilities (device DE) at step 94. As indicated by step 104, power converter CE may, in this type of situation, present a resistance R of less than 200 ohms across terminals DP and DN to indicate that power converter CE can comply with industry standards (i.e., USB-IF dedicated charger standards). Power converter CE and device DE may also communicate using signal pulses or other communications schemes (e.g., schemes of the type described in connection with FIGS. 3, 4, and 5). These signals may allow power converter CE to advertise its extended capabilities to device DE and may allow device DE to advertise its extended capabilities to power converter CE.

Once the presence of extended capabilities is recognized, power converter CE and device DE may use their extended capabilities (step 106). The extended capabilities that are used during the operations of step 106 may involve the delivery of amounts of current and voltage between power converter CE and device DE that are outside of industry specifications (i.e., that are above or below values permitted by USB-IF dedicated charger standards or other industry standards). As an example, power converter CE can deliver a voltage that is below the minimum required output voltage level for Vbus at a given current (i.e., 4.5 volts at 0.3 A). The use of this lowered voltage may help power converter CE conserve power when the full voltage level of Vbus is not required. As another example, power converter CE can deliver more current and voltage than permitted by the industry standards (i.e., a voltage of 6 volts and a current of 3 A). This allows power converter CE to deliver enlarged amounts of power to device DE (e.g., to support power-hungry operations, to shorten charging times, etc.). Data may also be exchanged between power converter CE and device DE during the operations of step 106 (e.g., diagnostics data from a log on power converter CE, status information, etc.). If desired, device DE may deliver power to power converter CE over power lines VBUS and GND (e.g., to allow power converter CE to function even in the event that AC-DC converter 20 is exhibiting a failure). Data may be exchanged using coded pulses or other suitable communications schemes.

The foregoing is merely illustrative of the principles of this invention and various modifications can be made by those skilled in the art without departing from the scope and spirit of the invention.

What is claimed is:

1. A power converter configured to supply power to external equipment, the power converter comprising:
   a connector having first and second power line contacts and first and second data line contacts;
   an alternating current (AC) to direct current (DC) converter circuit that is configured to supply the power to the external equipment by applying a DC power supply voltage across the first and second power line contacts when the connector is in connection with the external equipment; and
   control circuitry that is configured to detect signal pulses received from the external equipment over the first data line contact when the connector is in connection with the external equipment, wherein the control circuitry is configured to determine whether the external equipment has capabilities that extend beyond standards-compliant capabilities based on the detected signal pulses, and wherein the control circuitry is configured to adjust the DC power supply voltage applied by the AC to DC converter circuit across the first and second power line contacts in response to determining that the external equipment has capabilities that extend beyond the standards-compliant capabilities.

2. The power converter defined in claim 1, wherein the first and second power line contacts comprise Universal Serial Bus power line contacts and wherein the first and second data line contacts comprise Universal Serial Bus data line contacts.

3. The power converter defined in claim 1, wherein the control circuitry includes a resistance coupled between the first and second data line contacts, wherein the power converter further comprises a current source that is coupled to the second data line contact through the resistance, and wherein the current source is configured to transmit current pulses to the external equipment over the second data line contact while the connector is in connection with the external equipment.

4. The power converter defined in claim 1, wherein the control circuitry includes a resistance coupled between the first and second data line contacts, wherein the power converter further comprises a comparator having a first input coupled to the first data line contact through the resistance and having a second input coupled to a reference voltage, and wherein the comparator is configured to compare the signal pulses to the reference voltage.

5. The power converter defined in claim 1, wherein the standards-compliant capabilities comprise a limit selected from the group consisting of a limit on the maximum current and a limit on the maximum voltage of the DC power supply voltage.

6. The power converter defined in claim 1, wherein the capabilities that extend beyond standards-compliant capabilities comprise capabilities that extend beyond limits imposed by Universal Serial Bus Implementers Forum (USB-IF) industry standards.

7. The power converter defined in claim 6, wherein the capabilities that extend beyond the limits imposed by the USB-IF industry standards comprise a capability selected from the group consisting of: receiving the DC power supply voltage at a current greater than 1.5 amps, receiving the DC power supply voltage at a voltage of approximately 4.5 volts and, simultaneously, at a current of approximately 0.3 amps, and receiving the DC power supply voltage at a voltage of approximately 6 volts and, simultaneously, at a current of approximately 3.0 amps.

8. The power converter defined in claim 1, wherein the capabilities that extend beyond standards-compliant capabilities comprise a capability of the external equipment to draw a greater amount of power from the power converter than a maximum power limit imposed by an industry standard.

9. A power converter configured to supply power to external equipment, the power converter comprising:
   first and second power lines and first and second data lines;
   an alternating current (AC) to direct current (DC) converter circuit that is configured to apply a DC power supply voltage across the first and second power lines; and
   control circuitry that includes detector circuitry, wherein the detector circuitry is configured to detect signal pulses received from the external equipment over the first data line, and wherein the control circuitry is configured to control the AC to DC converter circuit based on the detected signal pulses.

10. The power converter defined in claim 9, wherein the control circuitry comprises a resistance coupled across the first and second data lines and a switch coupled in series with the resistance between the first and second data lines.

11. The power converter defined in claim 9, wherein the control circuitry comprises a resistance coupled across the first and second data lines, the power converter further comprising a current source coupled to the second data line through the resistance.

12. The power converter defined in claim 9, wherein the control circuitry comprises a resistance coupled across the first and second data lines, the power converter further comprising a comparator having an input coupled to the first data line through the resistance.

13. The power converter defined in claim 9, wherein the control circuitry is configured to determine whether the external equipment has capabilities that extend beyond standards-compliant capabilities based on the detected signal pulses, and wherein the control circuitry is configured to control the AC to DC converter circuit to increase the DC power supply voltage in response to determining that the external equipment has capabilities that extend beyond standards-compliant capabilities.

14. The power converter defined in claim 9, wherein the first and second power lines comprise Universal Serial Bus power lines and wherein the first and second data lines comprise Universal Serial Bus data line contacts.

15. A power converter configured to supply power to external equipment, the power converter comprising:
- a connector having first and second power line contacts and first and second data line contacts;
- an alternating current (AC) to direct current (DC) converter circuit that is configured to supply the power to the external equipment by applying a DC power supply voltage across the first and second power line contacts while the connector is in connection with the external equipment; and
- control circuitry that is configured to advertise to the external equipment that the power converter has capabilities that extend beyond standards-compliant capabilities by generating signal pulses and transmitting the signal pulses to the external equipment using the first data line contact while the connector is in connection with the external equipment.

16. The power converter defined in claim 15, wherein the control circuitry includes a resistance coupled between the first and second data line contacts, further comprising:
- a current source coupled to the first data line contact through the resistance, wherein the signal pulses comprise current pulses generated by the current source.

17. The power converter defined in claim 15, wherein the control circuitry includes a resistance coupled between the first and second data line contacts, further comprising:
- a switch coupled in series with the resistance between the first and second data line contacts, wherein the control circuitry is configured to transmit the signal pulses by toggling the switch while an external signal is received from the external equipment using the second data line contact.

18. The power converter defined in claim 15, wherein the control circuitry comprises detector circuitry that is configured to detect additional signal pulses received from the external equipment using the second data line contact while the connector is in connection with the external equipment.

19. The power converter defined in claim 18, wherein the control circuitry is configured to determine whether the external equipment has capabilities that extend beyond additional standards-compliant capabilities based on the detected additional signal pulses.

20. The power converter defined in claim 19, wherein the control circuitry is configured to control the AC to DC converter circuit to adjust the DC power supply voltage in response to determining that the external equipment has capabilities that extend beyond the additional standards-compliant capabilities.

* * * * *